(12) United States Patent
Shin et al.

(10) Patent No.: US 8,324,932 B2
(45) Date of Patent: Dec. 4, 2012

(54) HIGH-SPEED STATIC XOR CIRCUIT

(75) Inventors: Jin-Uk Shin, San Jose, CA (US);
Lancelot Y. Kwong, Freemont, CA (US); Gaurav Shrivastav, Sunnyvale, CA (US)

(73) Assignee: Oracle International Corporation, Redwood City, CA (US)

( * ) Notice: Subject to any disclaimer, the term of this patent is extended or adjusted under 35 U.S.C. 154(b) by 0 days.

(21) Appl. No.: 12/953,010

(22) Filed: Nov. 23, 2010

(65) Prior Publication Data
US 2012/0126852 A1 May 24, 2012

(51) Int. Cl.
*G06F 7/60* (2006.01)
(52) U.S. Cl. ............................................. 326/54; 326/55
(58) Field of Classification Search .................... 326/54, 326/104, 106, 112, 113, 119, 52, 55
See application file for complete search history.

(56) References Cited

U.S. PATENT DOCUMENTS

| | | | |
|---|---|---|---|
| 4,417,161 A * | 11/1983 | Uya | 326/55 |
| 4,562,365 A * | 12/1985 | Redfield | 326/55 |
| 4,621,338 A * | 11/1986 | Uhlenhoff | 708/702 |
| 5,694,061 A * | 12/1997 | Morosawa et al. | 326/119 |
| 6,677,782 B2 * | 1/2004 | Kanetani et al. | 326/95 |
| 7,292,069 B2 * | 11/2007 | Hannah et al. | 326/115 |
| 7,298,171 B2 * | 11/2007 | Parris | 326/55 |
| 7,417,468 B2 * | 8/2008 | Verbauwhede et al. | 326/112 |
| 2004/0008068 A1 * | 1/2004 | Kim | 327/218 |
| 2007/0008014 A1 * | 1/2007 | Parris | 326/121 |
| 2010/0001760 A1 * | 1/2010 | Balasubramanian et al. | 326/38 |

OTHER PUBLICATIONS

Kuo-Hsing Cheng and Ven-Chieh Hsieh, "High Efficient 3-input XOR for Low-Voltage Low-Power High-Speed Applications," AP-ASIC '99, IEEE, 1999, pp. 166-169. 4 Pages.

* cited by examiner

*Primary Examiner* — Thienvu Tran
(74) *Attorney, Agent, or Firm* — Brooks Kushman P.C.

(57) ABSTRACT

A static complementary transistor type logic gate circuit includes a plurality of input terminals for receiving a corresponding plurality of input signals, and an output terminal. The logic gate circuit further includes a first plurality of transistors of one conductivity type, arranged to form a plurality of pullup paths for selectively connecting the output terminal, through one or more intermediate nodes, to a positive supply voltage based on the plurality of input signals; and a second plurality of transistors of the complementary conductivity type, arranged to form a plurality of pulldown paths for selectively connecting the output terminal, through one or more intermediate nodes, to a negative supply voltage based on the plurality of input signals. A precharge device is configured to selectively charge an intermediate node to the far-side supply voltage when the intermediate node is disconnected from the near-side supply voltage and disconnected from the output terminal.

20 Claims, 2 Drawing Sheets

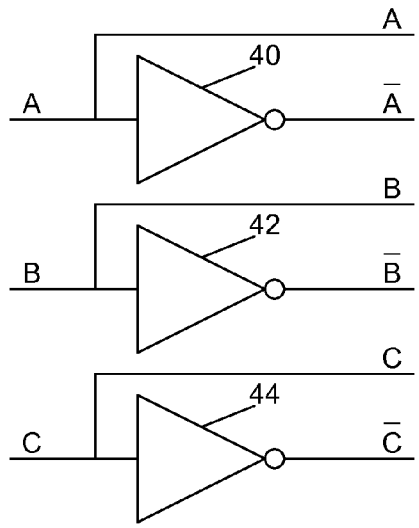
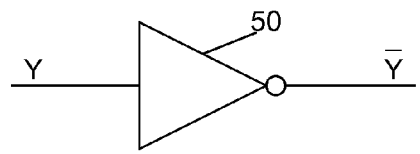
Fig. 3
Fig. 2
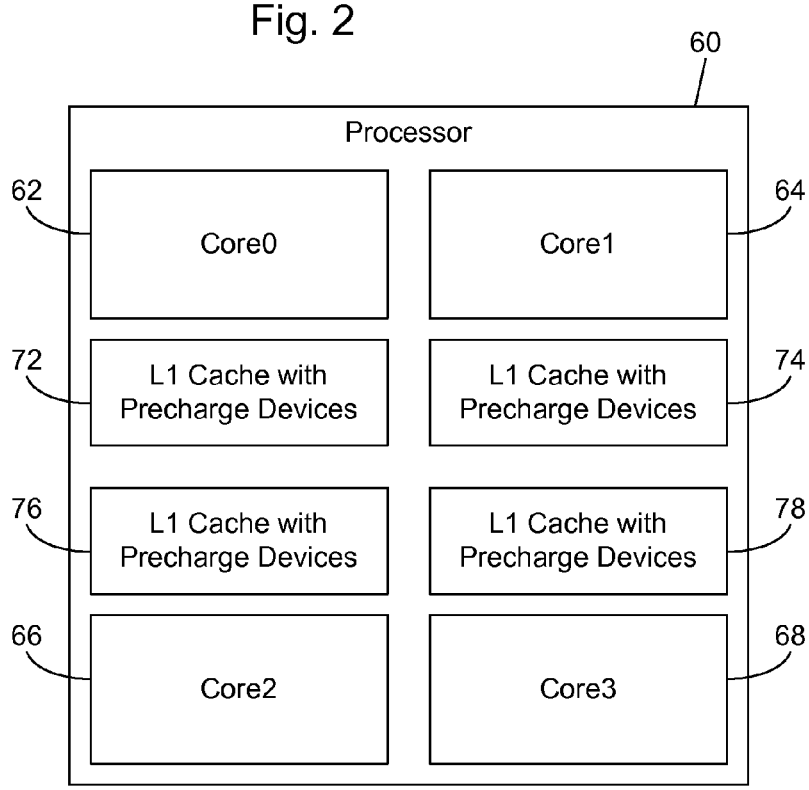
Fig. 4

US 8,324,932 B2

HIGH-SPEED STATIC XOR CIRCUIT

TECHNICAL FIELD

The invention relates to a high-speed static XOR circuit technique with reliable low voltage operation.

BACKGROUND

The use of CMOS circuits has become widespread. In an approach referred to as static CMOS, except during switching, the output is connected to either the positive supply voltage or the negative supply voltage through a low resistance path. In an approach referred to as dynamic CMOS, the output may rely on temporary storage of signal values on the capacitance of high impedance circuit nodes.

Currently, high speed XOR designs have mainly concentrated on a pass gate type of logic circuits, a dynamic CMOS approach. Such a design has a lesser transistor count, but will not work well at low voltages because pass gates could have a VT drop between the drain and source. As the technology shrinks, threshold voltage is becoming increasingly comparable to the supply voltage. Therefore, conventional circuit styles are increasingly risky on achieving reliable high speed operation.

In the conventional static CMOS XOR, the worst case path is when the PMOS closest to $V_{DD}$ has to pull up all the nets up to the lowermost NMOS which is closest to $V_{SS}$ (the same path exists for pull-down from the lowermost NMOS to the uppermost PMOS). This results in very slow transitions, especially at low voltage operation.

Background information may be found in Kuo-Hsing Cheng and Ven-Chieh Hsieh, "High Efficient 3-input XOR for Low-Voltage Low-Power High-Speed Applications," AP-ASIC '99, IEEE, 1999, pp. 166-169.

Further background information may be found in U.S. Pat. No. 4,417,161.

SUMMARY

In one embodiment, a static complementary transistor type logic gate circuit comprises a first input terminal for receiving a first input signal, a second input terminal for receiving a second input signal, a third input terminal for receiving a third input signal, and an output terminal. The logic gate circuit further comprises a first plurality of transistors of one conductivity type, and a second plurality of transistors of the complementary conductivity type. The first plurality of transistors are arranged to form a plurality of pullup paths for selectively connecting the output terminal, through one or more intermediate nodes, to a positive supply voltage based on the first, second, and third input signals. The second plurality of transistors are arranged to form a plurality of pulldown paths for selectively connecting the output terminal, through one or more intermediate nodes, to a negative supply voltage based on the first, second, and third input signals. A precharge device is configured to selectively charge an intermediate node to the far-side supply voltage when the intermediate node is disconnected from the near-side supply voltage and disconnected from the output terminal.

More particularly, for an intermediate node on a pullup path, the positive supply voltage is the near-side supply voltage and the negative supply voltage is the far-side supply voltage. For an intermediate node on a pulldown path, the negative supply voltage is the near-side supply voltage and the positive supply voltage is the far-side supply voltage.

It is appreciated that any embodiments of the invention may include one or more additional features that are comprehended by the invention.

For example, the logic gate circuit may further comprise first, second, and third inverters. The first inverter receives and inverts the first input signal to produce an inverted first input signal. The second inverter receives and inverts the second input signal to produce an inverted second input signal. The third inverter receives and inverts the third input signal to produce an inverted third input signal.

In further detail, each pullup path may selectively connect the output terminal to the positive supply voltage based on the first, second, and third input signals. Each pulldown path may selectively connect the output terminal to the negative supply voltage based on the first, second, and third input signals.

The first plurality of transistors and the second plurality of transistors may be arranged to form one or more of: an XOR logic gate circuit, an XNOR logic gate circuit, and a parity logic gate circuit.

Some embodiments of the invention comprise a plurality of precharge devices configured to selectively charge a corresponding plurality of intermediate nodes. Each particular precharge device is configured to selectively charge a corresponding particular intermediate node to the respective far-side supply voltage when the particular intermediate node is disconnected from the respective near-side supply voltage and disconnected from the output terminal. Each intermediate node that is charged by a corresponding precharge device may be connectable to the near-side supply voltage through a single transistor.

In one implementation, each pullup path connects the positive supply voltage through a series of transistors including a first pullup transistor, a second pullup transistor, and a third pullup transistor, to the output terminal. The first pullup transistor is controlled by the first signal. The second pullup transistor is controlled by the second signal. The third pullup transistor is controlled by the third signal. Each pulldown path connects the output terminal through a series of transistors including a first pulldown transistor, a second pulldown transistor, and a third pulldown transistor, to the negative supply voltage. The first pulldown transistor is controlled by the first signal. The second pulldown transistor is controlled by the second signal. The third pulldown transistor is controlled by the third signal.

In another embodiment of the invention, a static complementary transistor type logic gate circuit comprises a plurality of input terminals for receiving a corresponding plurality of input signals, and an output terminal. The logic gate circuit further comprises a first plurality of transistors of one conductivity type, arranged to form a plurality of pullup paths for selectively connecting the output terminal, through one or more intermediate nodes, to a positive supply voltage based on the plurality of input signals. The logic gate circuit further comprises a second plurality of transistors of the complementary conductivity type, arranged to form a plurality of pulldown paths for selectively connecting the output terminal, through one or more intermediate nodes, to a negative supply voltage based on the plurality of input signals. A precharge device is configured to selectively charge an intermediate node to the far-side supply voltage when the intermediate node is disconnected from the near-side supply voltage and disconnected from the output terminal.

In another embodiment of the invention, a processor comprises a cache including a static complementary transistor type logic gate circuit comprising a plurality of input terminals for receiving a corresponding plurality of input signals, and an output terminal. The logic gate circuit further comprises a first plurality of transistors of one conductivity type, arranged to form a plurality of pullup paths for selectively connecting the output terminal, through one or more intermediate nodes, to a positive supply voltage based on the plurality of input signals. The logic gate circuit further comprises a second plurality of transistors of the complementary conductivity type, arranged to form a plurality of pulldown paths for selectively connecting the output terminal, through one or more intermediate nodes, to a negative supply voltage based on the plurality of input signals. A precharge device is configured to selectively charge an intermediate node to the far-side supply voltage when the intermediate node is disconnected from the near-side supply voltage and disconnected from the output terminal.

There are many advantages associated with embodiments of the invention. For example, a static CMOS XOR circuit technique of the invention may allow 30% higher speed and reliable low voltage operation over the conventional design style.

There are many applications for embodiments of the invention. For example, embodiments of the invention may be suitable for use in parity/ECC logic (for example, L1 data cache for a processor). For example, embodiments of the invention may provide an improved high-speed three input static XOR circuit with reliable low voltage operation.

BRIEF DESCRIPTION OF THE DRAWINGS

FIG. 2 illustrates first, second, and third inverters for inverting first, second, and third input signals;

FIG. 3 illustrates an inverter for inverting the output signal; and

FIG. 4 illustrates a processor including multiple cores with each core having a level 1 cache including a logic gate circuit having precharge devices in an embodiment of the invention.

DETAILED DESCRIPTION

Figure 1:
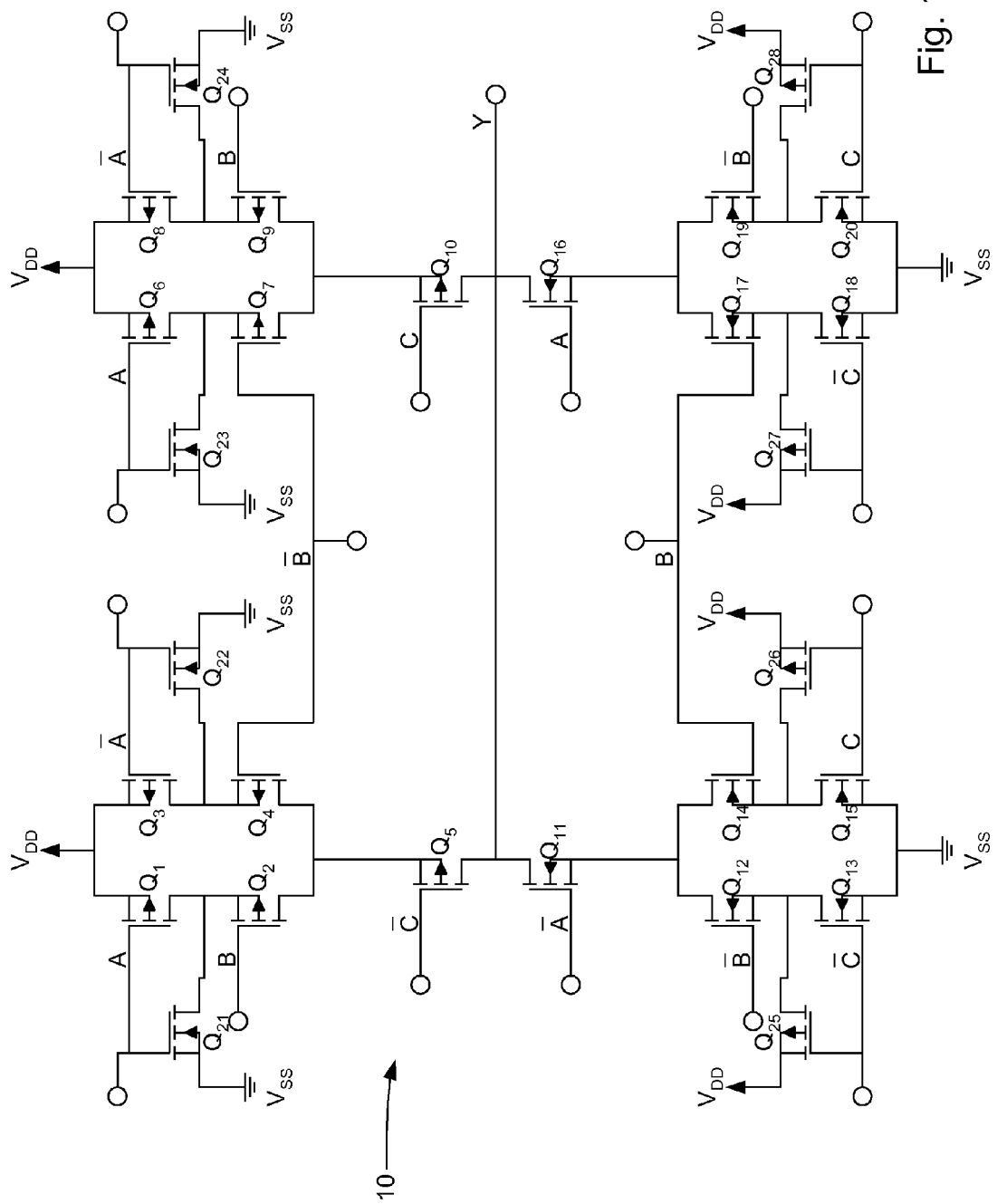
FIG. 1 illustrates a static complementary transistor type logic gate circuit in an embodiment of the invention.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

In one embodiment of the invention, the proposed design is basically a static CMOS XOR design to guarantee its functionality even at extremely low voltages. This XOR gate circuit can be used for high-speed parity and ECC (Error Correcting Code) logic in high-performance microprocessor designs. In further detail, the proposed design eliminates the worst case path. The PMOS has to precharge only up to the output node for the worst case. The same holds true for the pulldown path.

In this embodiment of the invention, this is accomplished by the following two changes: (1) small precharge devices at the nodes closest to power; (2) the order of input pins to the pullup and pulldown stacks is swapped.

FIG. 1 illustrates a static complementary transistor type logic gate circuit at 10. In this illustrated embodiment of the invention, the transistors are complementary metal oxide semiconductor (CMOS) transistors. It is appreciated that other complimentary transistors types may be used in other embodiments of the invention. Further, the illustrated circuit is arranged to form an XOR logic gate circuit. It is appreciated that other logic gate circuits are possible in accordance with the invention; for example, an XNOR logic gate circuit or some other parity logic gate circuit is possible.

The static CMOS XOR design of FIG. 1 depicts the positive supply voltage as $V_{DD}$ and the negative supply voltage as $V_{SS}$. The circuit 10 receives first input signal A, second input signal B, and third input signal C. The circuit further receives inverted first input signal $\overline{A}$, inverted second input signal $\overline{B}$, and inverted third input signal $\overline{C}$. Output signal Y is shown at the output terminal.

A plurality of PMOS transistors are arranged to form a plurality of pullup paths for selectively connecting the output terminal Y, through one or more intermediate nodes, to the positive supply voltage $V_{DD}$ based on the input signals. A plurality of NMOS transistors are arranged to form a plurality of pulldown paths for selectively connecting the output terminal Y, thorough one or more intermediate nodes, to the negative supply voltage $V_{SS}$ based on the input signals. The arrangement of the pullup paths and pulldown paths may take a variety of forms as understood by those of ordinary skill in the art.

In more detail, PMOS transistors $Q_1$, $Q_2$, $Q_3$, $Q_4$, and $Q_5$ compose a first pullup path. PMOS transistors $Q_6$, $Q_7$, $Q_8$, $Q_9$, and $Q_{10}$ form a second pullup path. NMOS transistors $Q_{11}$, $Q_{12}$, $Q_{13}$, $Q_{14}$, and $Q_{15}$ form a first pulldown path. NMOS transistors $Q_{16}$, $Q_{17}$, $Q_{18}$, $Q_{19}$, and $Q_{20}$ form a second pulldown path.

It is appreciated that various other logic gate circuits are possible, including any number of input terminals, including any number of output terminals, and including pullup and pulldown paths that may vary depending on the logic being implemented. Each pullup or pulldown path may or may not receive all of the inputs, depending on the application.

Embodiments of the invention involve the use of one or more precharge devices configured to selectively charge one or more corresponding intermediate nodes. In the XOR design of FIG. 1, PMOS transistors $Q_{21}$, $Q_{22}$, $Q_{23}$, and $Q_{24}$; and NMOS transistors $Q_{25}$, $Q_{26}$, $Q_{27}$, and $Q_{28}$ function as precharge devices.

Each precharge device is configured to selectively charge the corresponding intermediate node to the far-side supply voltage when the intermediate node is disconnected from the near-side supply voltage and disconnected from the output terminal Y. For example, transistor $Q_{28}$ has its source connected to $V_{DD}$, its gate connected to input signal C, and its drain connected to the intermediate node between transistors $Q_{19}$ and $Q_{20}$. For an intermediate node on a pulldown path, the negative supply voltage $V_{SS}$ is the near-side supply voltage, and the positive supply voltage $V_{DD}$ is the far-side supply voltage. Similarly, for an intermediate node on a pullup path, the positive supply voltage $V_{DD}$ is the near-side supply voltage, and the negative supply voltage $V_{SS}$ is the far-side supply voltage.

Further, in the illustrated static XOR design, the precharge devices are at the intermediate nodes closest to the power supply voltages; and the order of the input pins to the pullup and pulldown stacks is swapped (note the order of inputs in the pullup stack is A, B, C and the order of inputs in the pulldown stack is A, B, C as opposed to C, B, A).

With continuing reference to FIG. 1, as an example, consider the following transition for the inputs (ABC): 000-->100.

1. When (ABC)=000, the pulldown stack is active through the following path: $(\overline{A})(\overline{B}\cdot\overline{C}+B\cdot C)$. The second pulldown path (A)(B·C̄+B̄·C) is off. Because this path is off, the precharger device $Q_{28}$ connected to input C precharges the intermediate node between $Q_{19}$ and $Q_{20}$ to $V_{DD}$, and precharges the intermediate node between $Q_{16}$ and $Q_{19}$ to $V_{DD}-V_T$. $V_T$ is the threshold voltage.

2. When (ABC) transitions 000-->100, the condition of the two pulldown paths is swapped:
    1. path (Ā)(B̄·C̄+B·C) which was previously on, is now off;
    2. path(A)(B·C̄+B̄·C) is now on, and is trying to pull up the output node Y.
3. As a result, the pullup path does not need to charge up the intermediate nodes in the
NMOS stack.

It is appreciated that in the FIG. 1 implementation, in the example, the intermediate nodes in the NMOS stack, due to precharging, help pull up the output node Y. Similarly, when the output is switching from high to low, intermediate nodes in the PMOS stack, due to precharging, help pull down the output node Y.

It is appreciated that various implementations are possible for embodiments of the invention. Various locations for one or more precharge devices are possible. As shown in FIG. 1, the precharge devices and inputs are arranged to eliminate the worst case pullup and pulldown paths. However, embodiments of the invention are applicable to other logic gate circuits, and the precharge devices may be placed strategically depending on the application, particularly in applications where there are larger numbers of inputs and/or outputs.

FIG. 2 illustrates a first inverter 40, a second inverter 42, and a third inverter 44. Inverters 40, 42, and 44 provide inverted inputs Ā,B̄, and C̄ from the inputs A, B, and C. FIG. 3 illustrates an inverter 50 providing inverted output signal Ȳ from output signal Y.

The inverters 40, 42, and 44 may be used with or as part of the logic gate circuit 10 in FIG. 1. The addition of inverter 50 to the logic gate circuit 10 in FIG. 1 makes the circuit an XNOR. Another way to make the circuit 10 in FIG. 1 into an XNOR is to swap the input connections. More specifically, connecting signal A to the input Ā, connecting signal B to the input B̄, connecting signal C to the input C̄, connecting signal Ā to the input A, connecting signal B̄ to the input B, and connecting signal C̄ to the input C, results in the inverting of the output signal, making the circuit an XNOR.

FIG. 4 illustrates a processor 60 including multiple processor cores 62, 64, 66, and 68. Also shown in FIG. 4 are level 1 caches 72, 74, 76, and 78 for each core. In accordance with the invention, a cache may include a static complementary transistor type logic gate circuit including one or more precharge devices as described previously.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A static complementary transistor type logic gate circuit comprising:
    a first input terminal for receiving a first input signal;
    a second input terminal for receiving a second input signal;
    a third input terminal for receiving a third input signal;
    an output terminal;
    a first plurality of transistors of one conductivity type, arranged to form a plurality of pullup paths for selectively connecting the output terminal, through one or more intermediate nodes, to a positive supply voltage based on the first, second, and third input signals;
    a second plurality of transistors of the complementary conductivity type, arranged to form a plurality of pulldown paths for selectively connecting the output terminal, through one or more intermediate nodes, to a negative supply voltage based on the first, second, and third input signals; and
    a precharge device configured to selectively charge an intermediate node to a far-side supply voltage when the intermediate node is disconnected from a near-side supply voltage and disconnected from the output terminal.

2. The logic gate circuit of claim 1 further comprising:
    a first inverter receiving and inverting the first input signal to produce an inverted first input signal;
    a second inverter receiving and inverting the second input signal to produce an inverted second input signal; and
    a third inverter receiving and inverting the third input signal to produce an inverted third input signal.

3. The logic gate circuit of claim 1 wherein each pullup path selectively connects the output terminal to the positive supply voltage based on the first, second, and third input signals.

4. The logic gate circuit of claim 1 wherein each pulldown path selectively connects the output terminal to the negative supply voltage based on the first, second, and third input signals.

5. The logic gate circuit of claim 1 wherein the first plurality of transistors and the second plurality of transistors are CMOS transistors.

6. The logic gate circuit of claim 1 wherein the first plurality of transistors and the second plurality of transistors are arranged to form an XOR logic gate circuit.

7. The logic gate circuit of claim 1 wherein the first plurality of transistors and the second plurality of transistors are arranged to form an XNOR logic gate circuit.

8. The logic gate circuit of claim 1 wherein the first plurality of transistors and the second plurality of transistors are arranged to form a parity logic gate circuit.

9. The logic gate circuit of claim 1 further comprising:
    a plurality of precharge devices configured to selectively charge a corresponding plurality of intermediate nodes, wherein each particular precharge device is configured to selectively charge a corresponding particular intermediate node to a respective far-side supply voltage when the particular intermediate node is disconnected from a respective near-side supply voltage and disconnected from the output terminal.

10. The logic gate circuit of claim 9 wherein each intermediate node that is charged by a corresponding precharge device is connectable to the near-side supply voltage through a single transistor.

11. The logic gate circuit of claim 1 wherein the intermediate node that is charged by the precharge device is connectable to the near-side supply voltage through a single transistor.

12. The logic gate circuit of claim 1 wherein:
    each pullup path connects the positive supply voltage through a series of transistors including a first pullup transistor, a second pullup transistor, and a third pullup transistor, to the output terminal;
    the first pullup transistor being controlled by the first signal, the second pullup transistor being controlled by the second signal, and the third pullup transistor being controlled by the third signal;
    each pulldown path connects the output terminal through a series of transistors including a first pulldown transistor, a second pulldown transistor, and a third pulldown transistor, to the negative supply voltage; and the first pulldown transistor being controlled by the first signal, the second pulldown transistor being controlled by the second signal, and the third pulldown transistor being controlled by the third signal.

13. A static complementary transistor type logic gate circuit comprising:

a plurality of input terminals for receiving a corresponding plurality of input signals;

an output terminal;

a first plurality of transistors of one conductivity type, arranged to form a plurality of pullup paths for selectively connecting the output terminal, through one or more intermediate nodes, to a positive supply voltage based on the plurality of input signals;

a second plurality of transistors of the complementary conductivity type, arranged to form a plurality of pulldown paths for selectively connecting the output terminal, through one or more intermediate nodes, to a negative supply voltage based on the plurality of input signals; and a precharge device configured to selectively charge an intermediate node to a far-side supply voltage when the intermediate node is disconnected from a near-side supply voltage and disconnected from the output terminal.

14. The logic gate circuit of claim 13 wherein the first plurality of transistors and the second plurality of transistors are arranged to form one or more of: an XOR logic gate circuit, an XNOR logic gate circuit, and a parity logic gate circuit.

15. The logic gate circuit of claim 13 further comprising:

a plurality of precharge devices configured to selectively charge a corresponding plurality of intermediate nodes, wherein each particular precharge device is configured to selectively charge a corresponding particular intermediate node to a respective far-side supply voltage when the particular intermediate node is disconnected from a respective near-side supply voltage and disconnected from the output terminal.

16. The logic gate circuit of claim 15 wherein each intermediate node that is charged by a corresponding precharge device is connectable to the near-side supply voltage through a single transistor.

17. A processor comprising:

a cache including a static complementary transistor type logic gate circuit comprising:

a plurality of input terminals for receiving a corresponding plurality of input signals;

an output terminal;

a first plurality of transistors of one conductivity type, arranged to form a plurality of pullup paths for selectively connecting the output terminal, through one or more intermediate nodes, to a positive supply voltage based on the plurality of input signals;

a second plurality of transistors of the complementary conductivity type, arranged to form a plurality of pulldown paths for selectively connecting the output terminal, through one or more intermediate nodes, to a negative supply voltage based on the plurality of input signals; and a precharge device configured to selectively charge an intermediate node to a far-side supply voltage when the intermediate node is disconnected from a near-side supply voltage and disconnected from the output terminal.

18. The processor of claim 17 wherein the first plurality of transistors and the second plurality of transistors are arranged to form one or more of: an XOR logic gate circuit, an XNOR logic gate circuit, and a parity logic gate circuit.

19. The processor of claim 17 wherein the logic gate circuit further comprises:

a plurality of precharge devices configured to selectively charge a corresponding plurality of intermediate nodes, wherein each particular precharge device is configured to selectively charge a corresponding particular intermediate node to a respective far-side supply voltage when the particular intermediate node is disconnected from a respective near-side supply voltage and disconnected from the output terminal.

20. The processor of claim 19 wherein each intermediate node that is charged by a corresponding precharge device is connectable to the near-side supply voltage through a single transistor.

* * * * *

UNITED STATES PATENT AND TRADEMARK OFFICE
CERTIFICATE OF CORRECTION

| | |
|---|---|
| PATENT NO. | : 8,324,932 B2 |
| APPLICATION NO. | : 12/953010 |
| DATED | : December 4, 2012 |
| INVENTOR(S) | : Shin et al. |

It is certified that error appears in the above-identified patent and that said Letters Patent is hereby corrected as shown below:

On the Title Page,
Item (75), under "Inventors", line 2, delete "Freemont," and insert -- Fremont, --, therefor.

In column 4, line 43-56, delete "Each precharge ...... voltage." and insert the same on Col. 4, Line 42, after "devices." as a continuation of the same paragraph.

Signed and Sealed this
Twelfth Day of March, 2013

Teresa Stanek Rea
*Acting Director of the United States Patent and Trademark Office*